(12) United States Patent
Lee

(10) Patent No.: US 7,746,521 B2
(45) Date of Patent: Jun. 29, 2010

(54) ANALOG-TO-DIGITAL CONVERSION IN CMOS IMAGE SENSOR

(75) Inventor: Kwang-Hyun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 844 days.

(21) Appl. No.: 11/649,664

(22) Filed: Jan. 4, 2007

(65) Prior Publication Data
US 2007/0183006 A1 Aug. 9, 2007

(30) Foreign Application Priority Data
Feb. 3, 2006 (KR) ...................... 10-2006-0010759

(51) Int. Cl.
*H04N 1/04* (2006.01)
*H03M 1/00* (2006.01)
*H03M 1/56* (2006.01)

(52) U.S. Cl. ........................ 358/482; 341/128; 341/129; 341/169

(58) Field of Classification Search ...................... 257/5; 250/200, 559.05, 208.1; 341/1, 88, 115, 341/116, 128, 129, 169, 155, 170, 172; 358/513, 358/400, 474, 446, 447, 465, 482
See application file for complete search history.

(56) References Cited

U.S. PATENT DOCUMENTS

| | | | | |
|---|---|---|---|---|
| 6,144,331 A | * | 11/2000 | Jiang | 341/172 |
| 6,400,302 B1 | * | 6/2002 | Amazeen et al. | 341/172 |
| 6,433,727 B1 | * | 8/2002 | Yoshinaga | 341/172 |
| 6,563,363 B1 | * | 5/2003 | Tay | 327/337 |
| 6,885,331 B2 | | 4/2005 | Krymski | 341/169 |
| 7,102,558 B2 | * | 9/2006 | Deval | 341/150 |
| 7,403,150 B1 | * | 7/2008 | Heshami et al. | 341/159 |
| 2002/0122129 A1 | | 9/2002 | Lee | |
| 2007/0080842 A1 | * | 4/2007 | Kawahito | 341/155 |
| 2009/0102695 A1 | * | 4/2009 | Kawahito | 341/172 |

OTHER PUBLICATIONS

Korean Patent Application No. 1020010080480 to Choi, having Publication date of Jun. 25, 2003 (w/ English Abstract page).
Japanese Patent Application No. 2000-374283 to Rainer, having Publication date of Jul. 27, 2001 (w/ English Abstract page).
Korean Patent Application No. 1019970025197 to Choi et al., having Publication date of Jan. 19, 2000 (w/ English Abstract page).

* cited by examiner

*Primary Examiner*—Jerome Grant, II
(74) *Attorney, Agent, or Firm*—Monica H. Choi

(57) ABSTRACT

An analog-to-digital converter in an image sensor is implemented with a plurality of comparator units. Each comparator unit has a respective capacitor array and respective switches integrated therein. Such capacitors and switches across the comparator units are operated for generating ramp voltages for such comparator units for performing analog-to-digital conversion with correlated double sampling. Thus, circuit area and power consumption of the CMOS image sensor may be minimized.

20 Claims, 10 Drawing Sheets

ANALOG-TO-DIGITAL CONVERSION IN CMOS IMAGE SENSOR

This application claims priority under 35 U.S.C. §119 to Korean Patent Application No. 10-2006-0010759, filed on Feb. 3, 2006 in the Korean Intellectual Property Office, the disclosure of which is incorporated herein in its entirety by reference.

BACKGROUND OF THE INVENTION

1. Field of the Invention

The present invention relates generally to CMOS image sensors, and more particularly, to analog-to-digital conversion in the CMOS image sensor with correlated double sampling (CDS) using a switched capacitor array for generating ramp voltages.

2. Background of the Invention

An image sensor captures an image using an array of photodiodes that react to light. Since the brightness and wavelengths of light emitted from different portions of an object are different, each of the pixels in the array of photodiodes generates a corresponding electrical value that is converted by the image sensor into a form for further signal processing.

A charge coupled device (CCD) is common in some conventional image sensors. However, with the rapid development of CMOS (complementary metal oxide semiconductor) technology, an image sensor now includes CMOS transistors, being referred to as a CMOS image sensor. A CMOS image sensor includes an analog-to-digital converter (ADC) while an ADC is implemented by a separate integrated circuit in the CCD image sensor. In addition, the CMOS image sensor operates at lower voltage, consumes lower power, and is readily integrated into a standard CMOS process, in contrast to the CCD image sensor. Therefore, the CMOS image sensor is already used in many fields and is expected to replace the CCD image sensor in many other fields.

FIG. 1 is a block diagram of a conventional CMOS image sensor 10. Referring to FIG. 1, the CMOS image sensor 10 includes a pixel array 20, a control circuit 30, a row driver 40, an ADC block 50, and a column driver 60.

The pixel array 20 includes a plurality of pixels (not shown) arranged in a matrix for sensing an image. The control circuit 30 generates a plurality of control signals for controlling the row driver 40 and the column driver 60. The row driver 40 selects a particular row in the pixel array 20 in response to such control signals. The ADC block 50 receives pixel signals from pixels of the selected particular row and converts the pixel signals into digital signals. The column driver 60 selects a digital signal for a particular column in response to the control signals from the control circuit 30.

FIG. 2 is a circuit diagram of a conventional 4-transistor unit pixel 200 in the pixel array 20 of FIG. 1. Referring to FIG. 2, the unit pixel 200 includes a photodiode 210, a transfer transistor 220, a source follower 230, a reset transistor 240, and a selection transistor 250.

A voltage is generated from the photodiode 210 according to the amount of external light received by the photodiode 210. The transfer transistor 220 transfers such a voltage from the photodiode 210 to a gate of the source follower 230. The source follower 230 generates a source-drain current based on the voltage transferred by the transfer transistor 220. The reset transistor 240 applies a reset voltage to the gate of the source follower 230. The selection transistor 250 outputs a voltage generated at the source follower 230 as a pixel output of the unit pixel 200 in response to a signal Sx output from the row driver 40.

The unit pixel 200 performs a reset operation by turning on the reset transistor 240 and outputs a reset voltage according to the reset operation. The photodiode 210 accumulates photo charges according to the amount of light incident after the reset operation. A voltage is generated at the photodiode from the photo charges accumulated for a predetermined period of time, and a resulting pixel voltage is output.

A process of performing analog-to-digital conversion from a difference between the reset voltage and the pixel voltage for a pixel is referred to as CDS (correlated double sampling). FIG. 3 is a block diagram of the image sensor 10 including the conventional ADC (analog-to-digital converter) block 50 with CDS (correlated double sampling). Referring to FIG. 3, the ADC block 50 includes a ramp generator 51, a plurality of comparator circuits 52-1 through 52-N, a gray code generator 53, and a column memory 54.

The ramp generator 51 generates an upward ramp signal Vup and a downward ramp signal Vdn. Each of the plurality of the comparator circuits 52-1 through 52-N includes a pair of switches (e.g., SW11 and SW21), a pair of capacitors (e.g., C11 and C21), and a comparator (e.g., COM1). The gray code generator 53 generates a sequentially increasing gray code. The column memory 54 stores a respective gray code from the gray code generator 53 for each of the comparator circuits 52-1 through 52-N when the respective output of each of the comparators COM1 through COMN makes a logical transition.

The row driver 40 resets pixels (not shown) within a particular row in the pixel array 20. Subsequently, when reset voltages are output from such pixels, switches SW11 through SW1N are turned on (while switches SW21 through SW2N are turned off), and the reset voltages are respectively stored in corresponding capacitors C11 through C1N.

Thereafter, when pixel signal voltages are output from such pixels, the switches SW11 through SW1N are turned off, and the switches SW21 through SW2N are turned on. Thus, the pixel signal voltages are respectively stored in corresponding capacitors C21 through C2N. Here, the ramp voltages Vup and Vdn of the ramp generator 51 are maintained constant such that a difference between respective reset and pixel signal voltages is input across the respective two inputs of each of the comparators COM1 through COMN.

After the reset voltages and the pixel signal voltages are stored in the capacitors C11 through C1N and C21 through C2N, the ramp voltages Vup and Vdn from the ramp generator 51 start increasing and decreasing, respectively, in opposite directions. With such change of the ramp voltages Vup and Vdn, the respective inputs of each of the comparators COM1 through COMN eventually becomes equal and then reverses at a respective time point when a respective output makes a logical transition.

Such a respective time point for each of the comparators COM1 through COMN depends on the respective pixel signal voltage. Thus, such a respective time point indicates the level of the respective pixel signal voltage as represented by the respective gray code from the gray code generator 53 at that time point. The column driver 60 sequentially outputs such gray code values stored in the column memory 54 in response to a control signal received from the control circuit 30.

Unfortunately, the image sensor 10 uses the ramp signal generator 51 that is separately installed within the image sensor 10. Thus, a large circuit area is required in the prior art. In addition, the ramp signals generated by the ramp signal generator 51 may have poor monotonicity such that analog-to-digital conversion cannot be performed accurately in the image sensor 10 of the prior art.

SUMMARY OF THE INVENTION

Accordingly, an analog-to-digital converter uses an array of switched capacitors integrated into an image sensor for generating ramp voltages.

In one aspect of the present invention, an analog-to-digital converter in an image sensor includes a plurality of comparator units and a controller. Each comparator unit includes a respective comparator, respective switches, a first respective capacitor coupled between a first node and a respective third node, a second respective capacitor coupled between a second node and a respective fourth node, a third respective capacitor coupled between the first node and a first input of the respective comparator, and a fourth respective capacitor coupled between the second node and a second input of the respective comparator.

The controller controls the respective switches to couple a subset of the first respective capacitors of the plurality of comparator units between the first node and a first reference voltage, and to couple another subset of the first respective capacitors between the first node and a second reference voltage, for generating a first ramp voltage at the first node.

In addition, the controller controls the respective switches to couple a subset of the second respective capacitors of the plurality of comparator units between the second node and the first reference voltage, and to couple another subset of the second respective capacitors between the second node and the second reference voltage, for generating a second ramp voltage at the second node.

In an example embodiment of the present invention, the respective switches for each comparator unit include a first respective switch for coupling a pixel signal to the first input of the respective comparator, a second respective switch for coupling a reset signal to the second input of the respective comparator, third and fourth respective switches for coupling the first reference voltage to one of the respective third and fourth nodes, and fifth and sixth respective switches for coupling the second reference voltage to the other one of the respective third and fourth nodes.

In another embodiment of the present invention, the first reference voltage is lower than the second reference voltage, and the controller controls the third, fourth, fifth, and sixth respective switches such that the second reference voltage is coupled to the respective third node and the first reference voltage is coupled to the respective fourth node when the pixel signal is coupled to the first input of the respective comparator and when the reset signal is coupled to the second input of the respective comparator, during first and second switching operations, In addition, the controller controls the first and second respective switches to be opened during a third switching operation. In that case, the controller controls the third, fourth, fifth, and sixth respective switches for determining which one of the respective third and fourth nodes is coupled to the first reference voltage with the other one of the respective third and fourth nodes being coupled to the second reference voltage during the third switching operation.

In a further embodiment of the present invention, the analog-to-digital converter also includes a first global switch for coupling a third reference voltage to the first node during the first and second switching operations, and includes a second global switch for coupling the third reference voltage to the second node during the first and second switching operations. The first and second global switches are opened during the third switching operation.

In an example embodiment of the present invention, the first and second ramp voltages are each changed in incremental steps of a difference between the first and second reference voltages divided by a number of the plurality of comparator units.

The analog-to-digital converter may be used to particular advantage in a CMOS (complementary metal oxide semiconductor) image sensor with a code generator that generates a bit code that changes with time. In that case, a memory stores a respective bit code from the code generator when a respective output of the respective comparator makes a logical transition. Such a respective bit code is the digital code indicating the level of the pixel signal.

In this manner, capacitors and switches that are integrated as part of each pixel comparator unit are used for generating the ramp signals during analog-to-digital conversion with correlated double sampling. Thus, the circuit area may be reduced without a separate ramp signal generator.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and/or function.

DETAILED DESCRIPTION OF THE INVENTION

Figure 1:
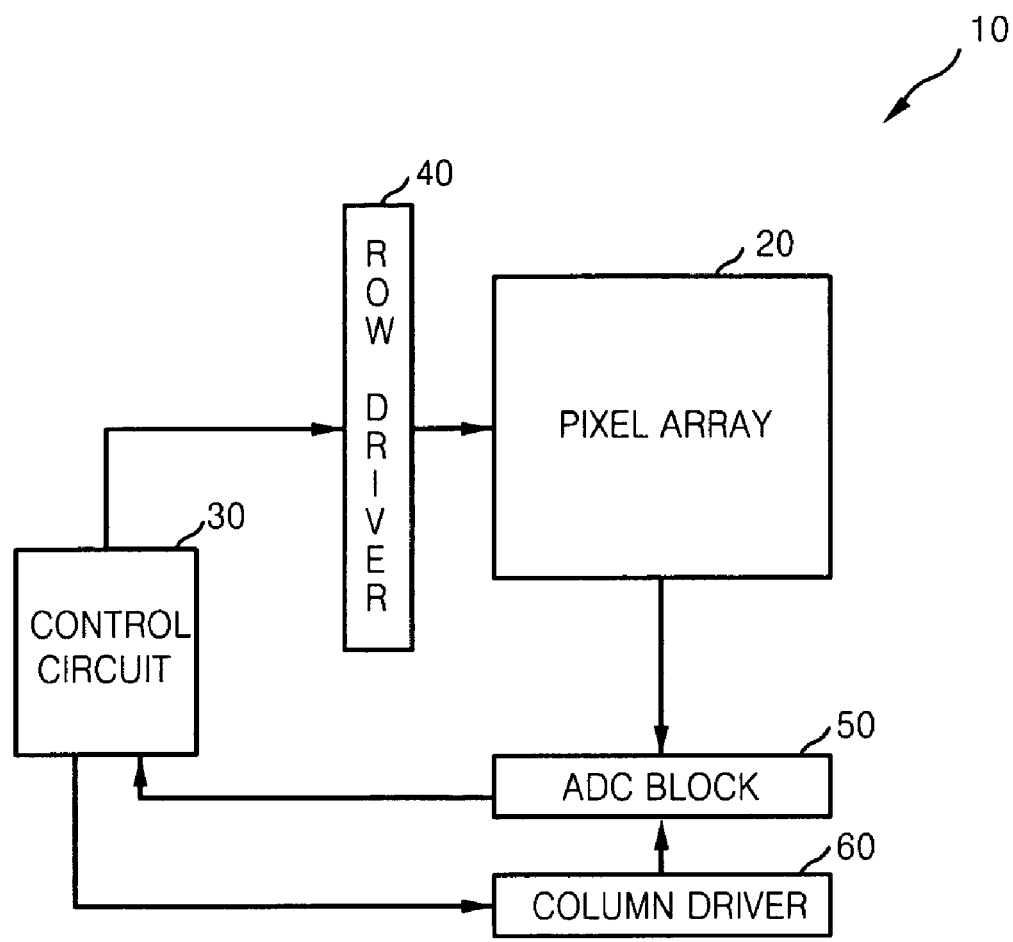
FIG. 1 is a block diagram of a conventional complementary metal-oxide semiconductor (CMOS) image sensor.
Figure 2:
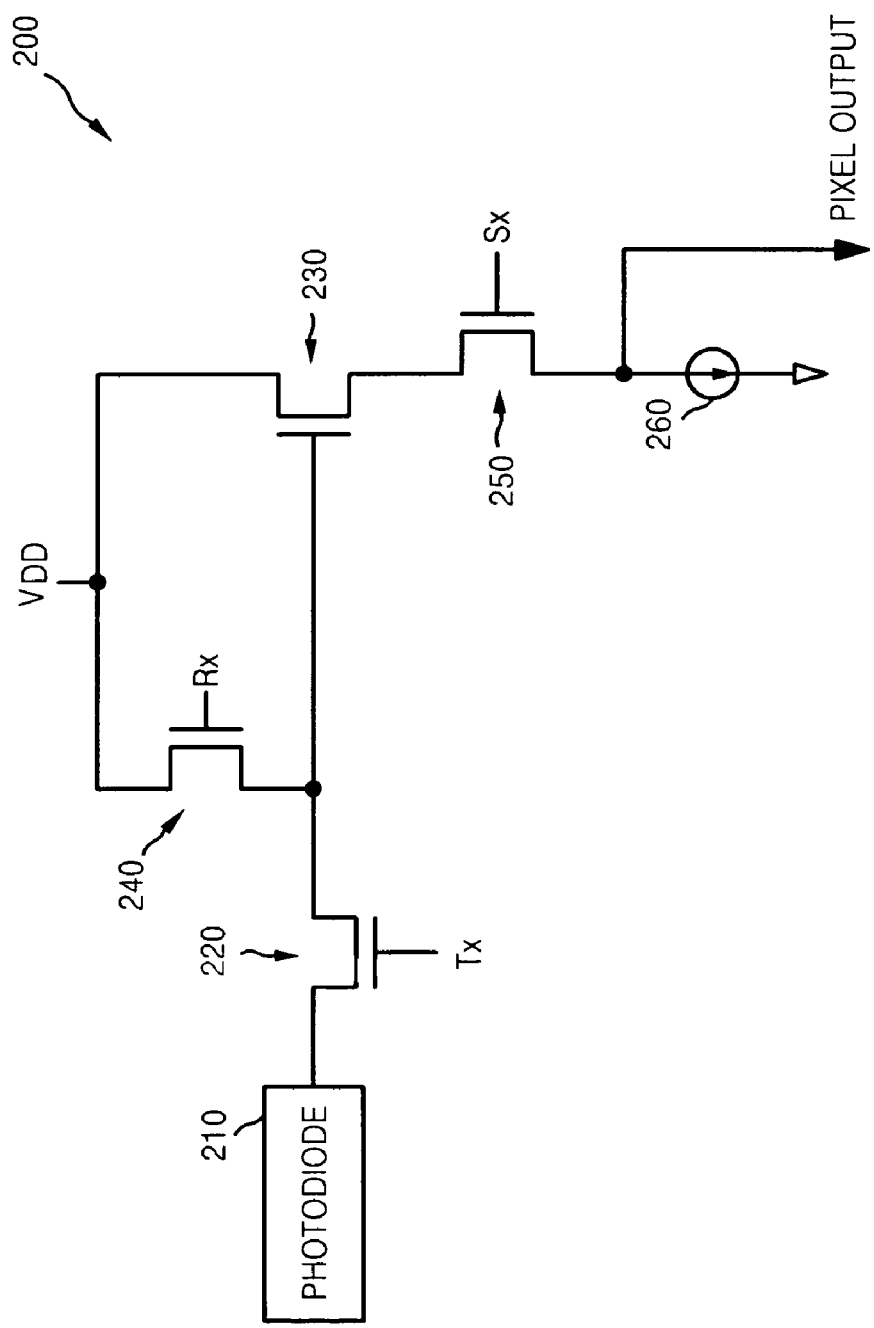
FIG. 2 is a circuit diagram of a conventional 4-transistor unit pixel in the CMOS image sensor of FIG. 1.
Figure 3:
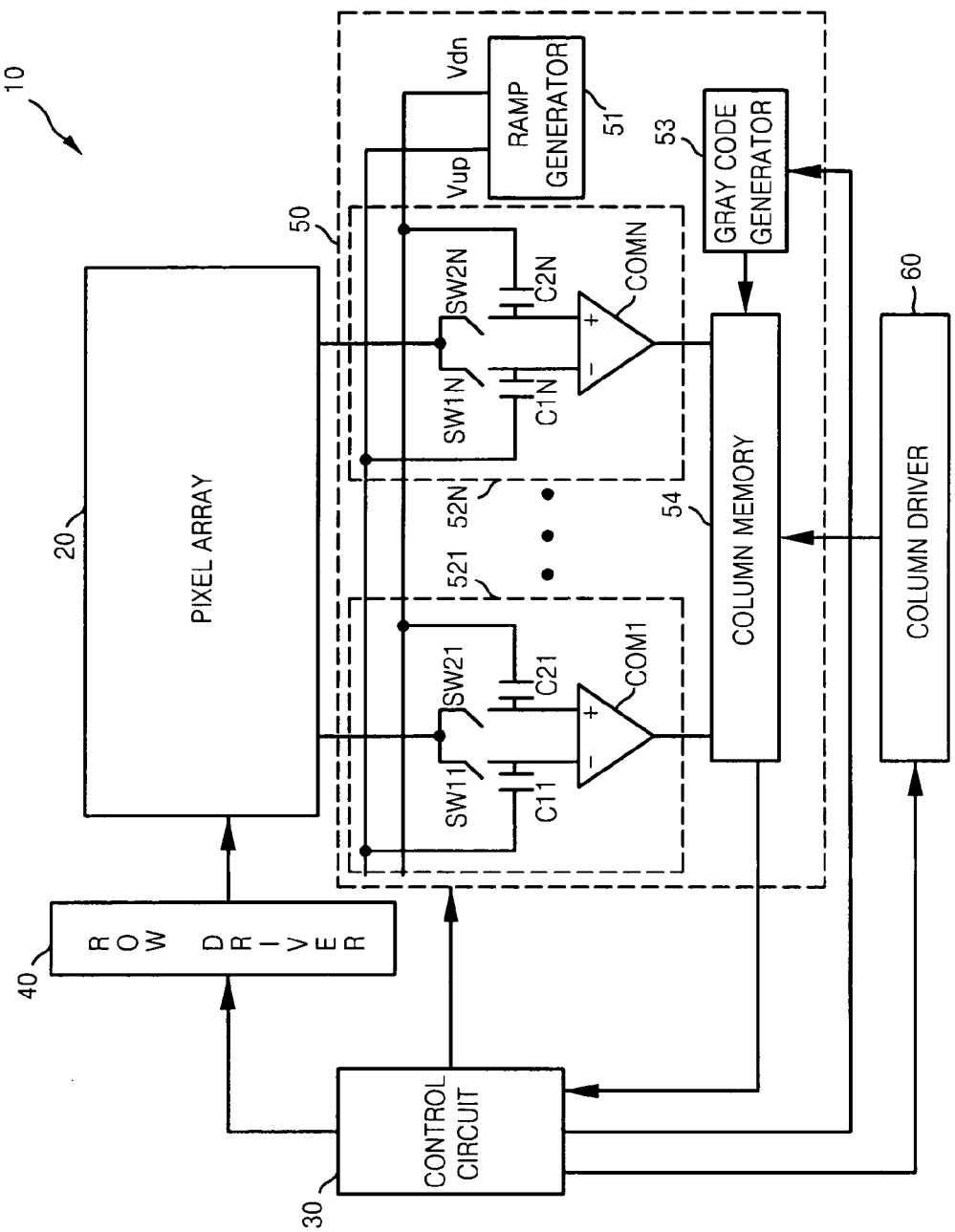
FIG. 3 is a block diagram of the image sensor of FIG. 1 including a conventional analog-to-digital converter (ADC) block using correlated double sampling (CDS)
Figure 4:
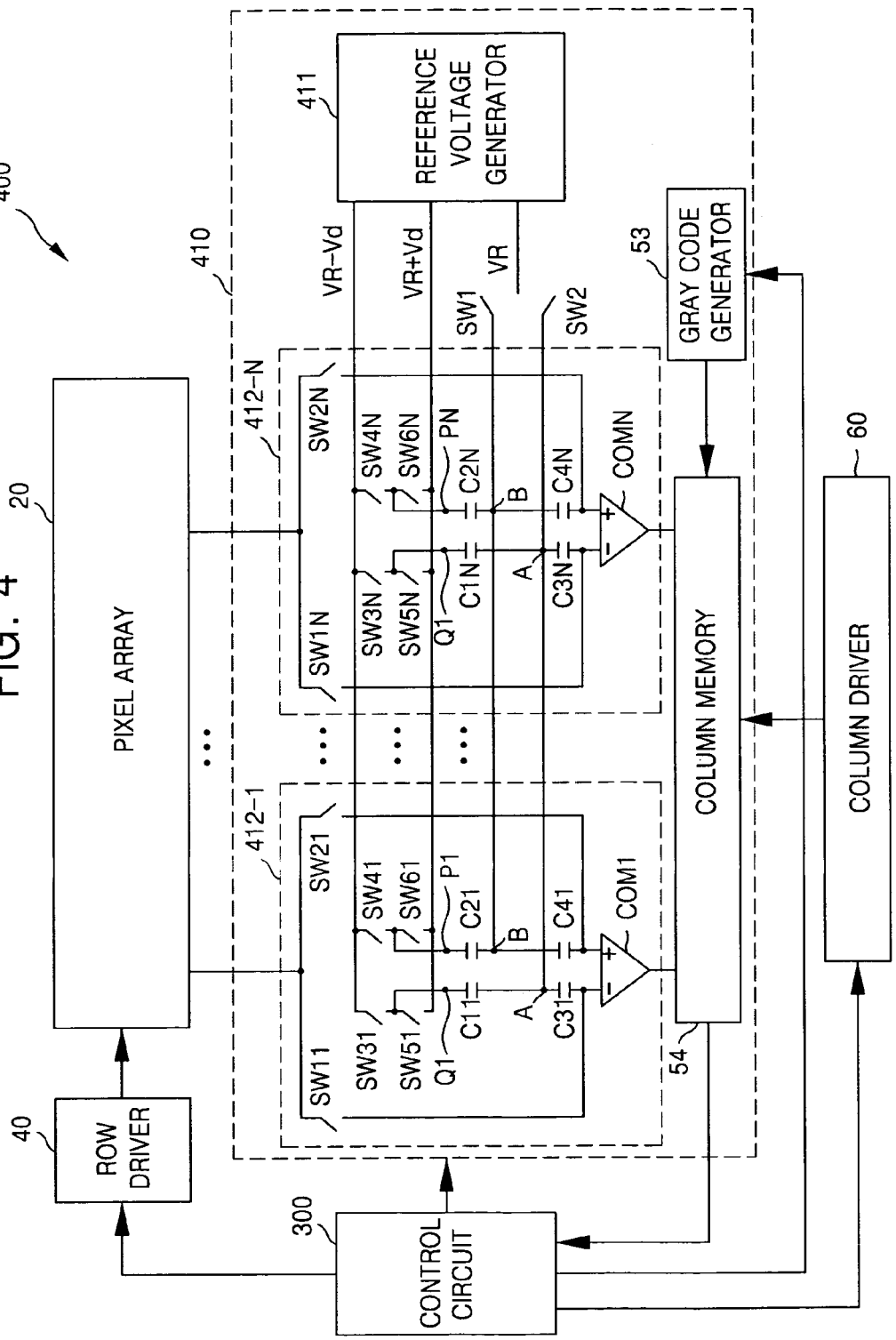
FIG. 4 is a block diagram of an image sensor including an ADC block with CDS according to an embodiment of the present invention.

FIG. 4 is a block diagram of an image sensor 400 including an analog-to-digital converter (ADC) block 410 with correlated double sampling (CDS) according to an embodiment of the present invention. Referring to FIG. 4, the ADC block 410 includes a reference voltage generator 411, a plurality of comparator units 412-1 through 412-N, a gray code generator 53, and a column memory 54. The reference voltage generator 411 generates a middle reference voltage VR, a low reference voltage VR−Vd that is lower than the middle reference voltage VR, and a high reference voltage VR+Vd that is higher than the middle reference voltage VR.

Each of the plurality of the comparator units 412-1 through 412-N compares a respective pixel signal and a respective reset signal to generate a respective output from the respective comparison result. Each of the plurality of comparator units 412-1 through 412-N, such as the comparator unit 412-1 for example, includes a respective plurality of switches SW1, SW2, SW11, SW21, SW31, SW41, SW51, and SW61; a respective comparator COM1; and a respective capacitor array C11, C21, C31 and C41.

A first global switch SW1 and a second global switch SW2 are controlled by a control circuit 300 to couple or disconnect the middle reference voltage VR to/from a first node A and a second node B, respectively. The respective switches SW31, SW41, SW51, and SW61 are controlled by the control circuit 300 to couple one of the low and high reference voltages VR−Vd and VR+Vd to each of a respective third node $Q_1$ and a respective fourth node $P_1$ within each comparator unit 412-1.

Each comparator COM1 includes a first respective input terminal (i.e., a negative terminal) receiving a respective pixel signal and a second respective input terminal (i.e., a positive terminal) receiving a respective reset signal. The capacitor array within each comparator COM1 includes a first respective capacitor C11 connected between the respective third node $Q_1$ and the first node A, a second capacitor C21 connected between the respective fourth node $P_1$ and the second node B, a third capacitor C31 connected between the first node A and the first input terminal of the comparator COM1, and a fourth capacitor C41 connected between the second node B and the second input terminal of the comparator COM1.

Respective components of the example comparator unit 412-1 have been described. However, each of the rest of the comparator units 412$_2$ through 412-N include such similar respective components configured in a similar manner as described for the example comparator unit 412-1.

Note that the first node A and the second node B are common to all of the comparator units 412$_2$ through 412-N. However, each of the comparator units 412$_2$ through 412-N includes a respective third node Q2 through QN and a respective fourth node P2 through PN.

The gray code generator 53 generates a sequentially increasing gray code in response to a control signal, for example, a clock signal, received from the control circuit 300. The present invention may also be practiced with any code generator that generates a bit code that changes with time.

The column memory 54 receives such incrementing gray code and stores a respective gray code received at a respective time point when the respective output of each of the comparator units 412-1 through 412-N makes a logical transition. Such a stored respective gray code indicates a level of the respective pixel signal received at each of the comparator units 412-1 through 412-N.

Figure 5:
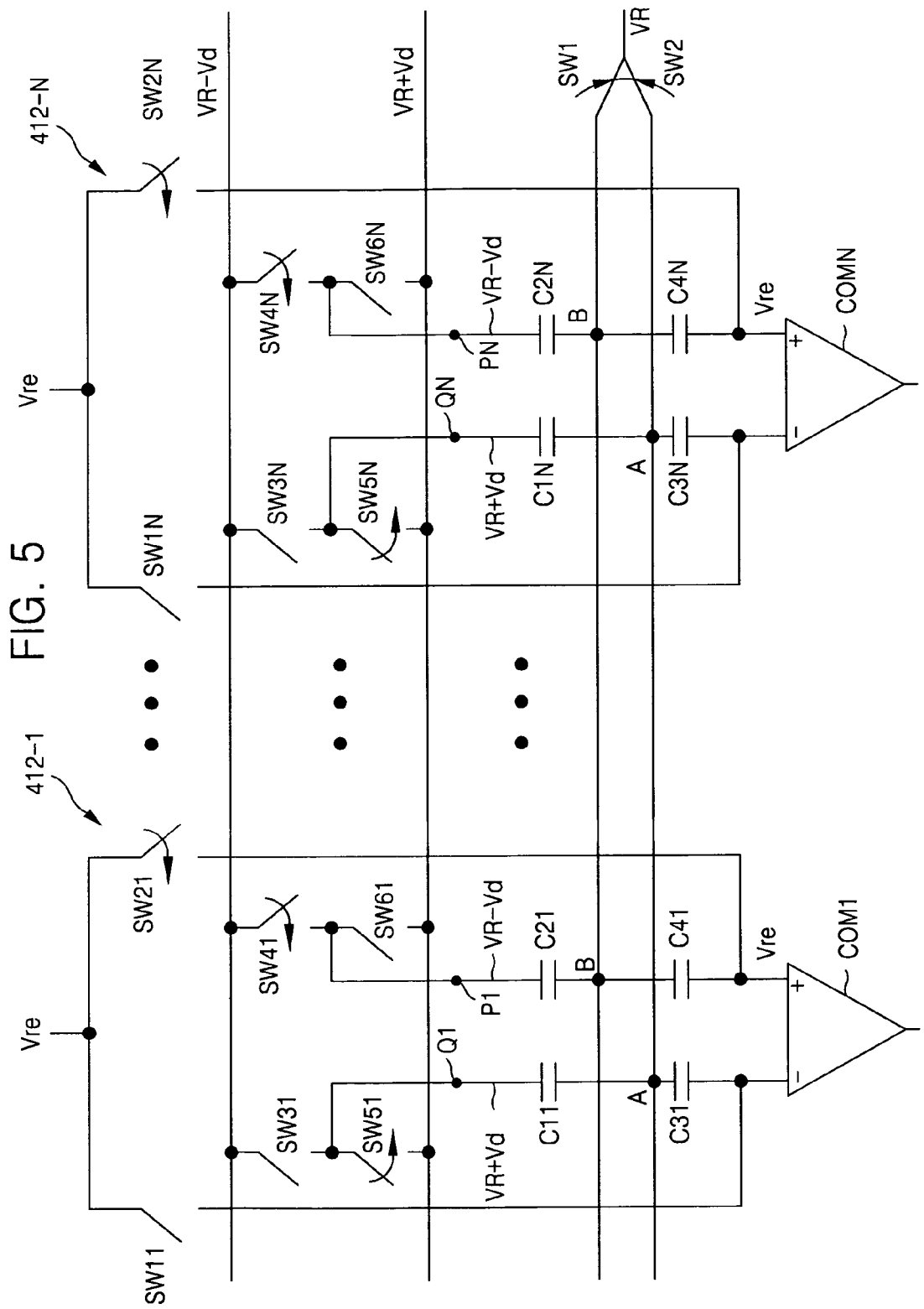
FIG. 5 is a circuit diagram illustrating a first switching operation for the comparator units of FIG. 4, according to an embodiment of the present invention.

FIG. 5 is a circuit diagram illustrating a first switching operation for the comparator units 412-1 through 412-N of FIG. 4. Referring to FIG. 5, when pixels from the pixel array 20 output respective reset voltages Vre, the switches SW21 through SW2N of the plurality of the comparator units 412-1 through 412-N are closed. In addition, the global switches SW1 and SW2 are closed to apply the first reference voltage VR at the first and second nodes A and B.

Furthermore during such a first switching operation, in each of the plurality of the comparator units 412-1 through 412-N, such as the comparator unit 412-1, the respective switches SW41 and SW51 are closed and the respective switches SW31 and SW61 are opened. Thus, a respective voltage corresponding to a difference between the respective reset voltage Vre and the first reference voltage VR is stored in the respective fourth capacitor C41, and similarly within each of the comparator units 412$_2$ through 412-N. Also, a voltage difference (−Vd) between the respective fourth node $P_1$ and the second node B is stored in the respective second capacitor C21, and similarly within each of the comparator units 412$_2$ through 412-N.

Figure 6:
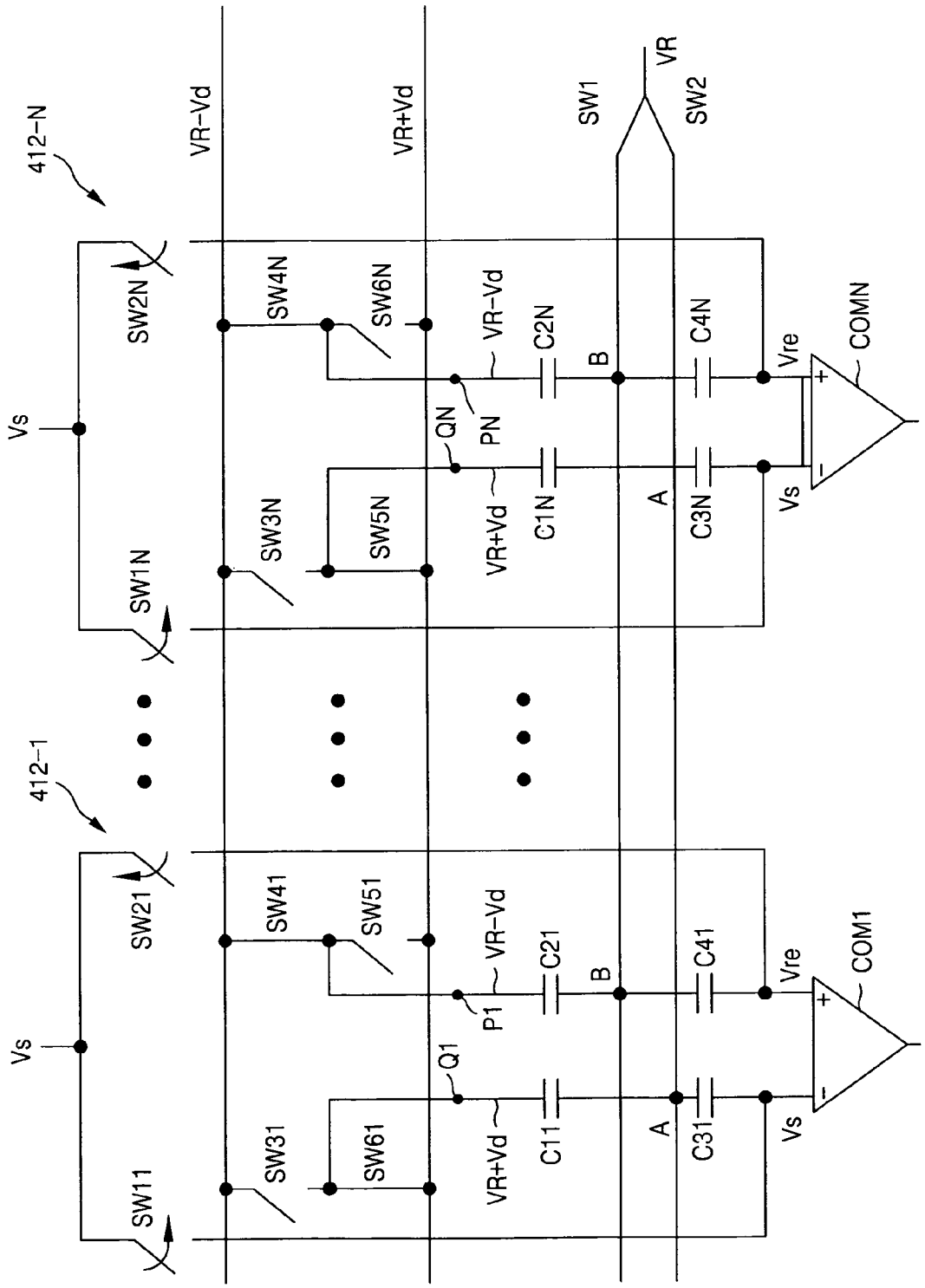
FIG. 6 is a circuit diagram illustrating a second switching operation for the comparator units of FIG. 4, according to an embodiment of the present invention.

FIG. 6 is a circuit diagram illustrating a second switching operation for the comparator units 412-1 through 412-N of FIG. 4. Referring to FIG. 6, when pixels of the pixel array 20 output respective pixel signal voltages Vs, the switches SW11 through SW1N of the plurality of the comparator units 412-1 through 412-N are closed and the switches SW21 through SW2N are opened.

Accordingly, a respective voltage corresponding to a difference between the respective pixel signal voltage Vs and the first reference voltage VR is stored in the respective third capacitor C31, and similarly within each of the comparator units 412$_2$ through 412-N. In addition during the second switching operation, a voltage difference (Vd) between the respective third node $Q_1$ and the first node A is stored in the respective first capacitor C11, and similarly within each of the comparator units 412$_2$ through 412-N.

Figure 7:
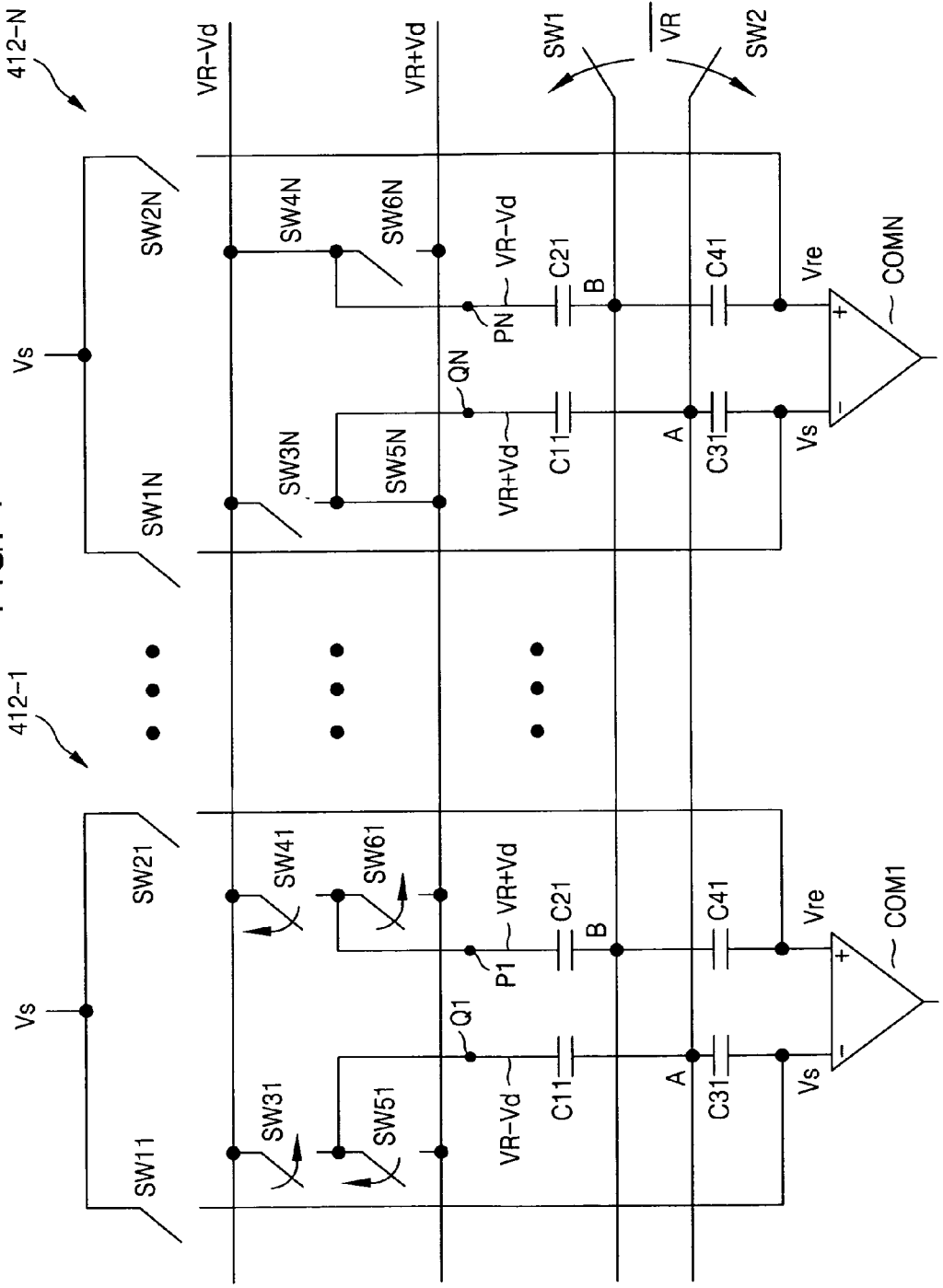
FIG. 7 is a circuit diagram illustrating a third switching operation for the comparator units of FIG. 4, according to an embodiment of the present invention.

FIG. 7 is a circuit diagram illustrating a third switching operation after the second switching operation for the comparator units 412-1 through 412-N of FIG. 4. During the third switching operation, the global switches SW1 and SW2 are opened. In addition, the switches SW31 through SW3N, SW41 through SW4N, SW51 through SW5N, and SW61 through SW6N are controlled by the control circuit 300 such that one of the respective third and fourth nodes Q1 and P1 for example is coupled to the high reference voltage VR+Vd while the other one of such nodes Q1 and P1 is coupled to the low reference voltage VR−Vd, for each of the comparator units 412-1 through 412-N.

Figure 8:
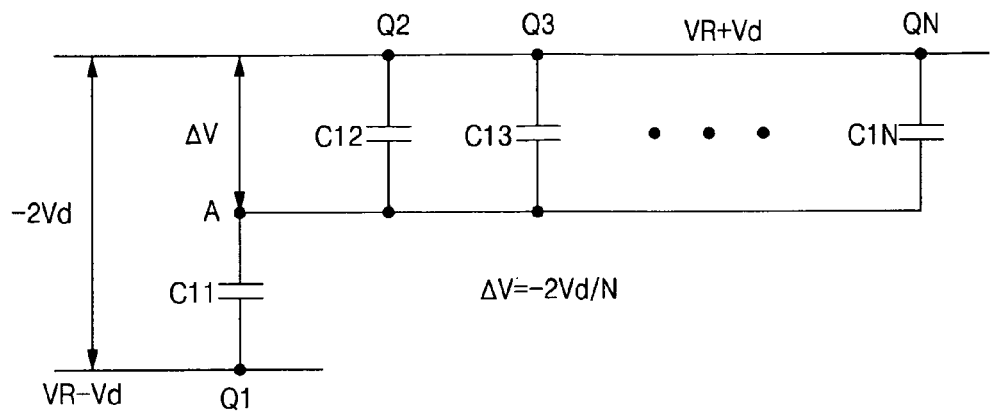
FIG. 8 is a circuit diagram illustrating a voltage change at a first node in FIG. 7, according to an embodiment of the present invention.

In the example illustration of FIG. 7, the switches SW31 and SW61 are closed and the switches SW41 and SW51 are opened within the first comparator unit 412-1. FIG. 8 is a circuit diagram illustrating a voltage change at the first node A from the configuration of the capacitors in FIG. 7. In that case, the respective third node Q1 of the comparator unit 412-1 is coupled to the low reference voltage VR−Vd while the respective third nodes Q2 through QN of the rest of the comparator units 412$_2$ through 412-N are coupled to the high reference voltage VR+Vd, as illustrated in FIG. 8.

Referring to the example of FIG. 8, assume that the capacitors C11 through C1N have the same capacitance value (i.e., C11=C12= . . . C1N=C). In that case, a voltage of the first node A increases by 2Vd/N, with N being the total number of the comparator units 412-1 through 412-N.

Figure 9:
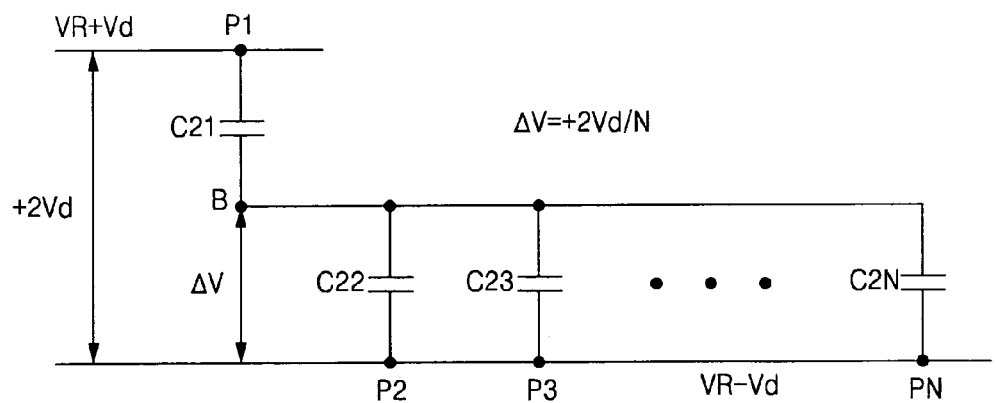
FIG. 9 is a circuit diagram illustrating a voltage change at a second node in FIG. 7, according to an embodiment of the present invention.

FIG. 9 is a circuit diagram illustrating a voltage change at the second node B from the configuration of the capacitors in FIG. 7. In that case from capacitive voltage division, the respective fourth node P1 of the comparator unit 412-1 is coupled to the high reference voltage VR+Vd while the respective fourth nodes P2 through PN of the rest of the comparator units 412$_2$ through 412-N are coupled to the low reference voltage VR−Vd, as illustrated in FIG. 9.

Referring to FIG. 9, assume that the capacitors C21 through C2N have the same capacitance value (i.e., C21=C22= . . . C2N=C). In that case from capacitive voltage division, a voltage of the second node B decreases by 2Vd/N, with N being the total number of the comparator units 412-1 through 412-N. When similar third switching operations are performed sequentially through the rest of the comparator units 412₂ through 412-N, the voltage at the first node A increases as a ramp by increments of 2Vd/N, and the voltage at the second node B decreases as a ramp by increments of 2Vd/N, as illustrated in FIG. 10.

Figure 10:
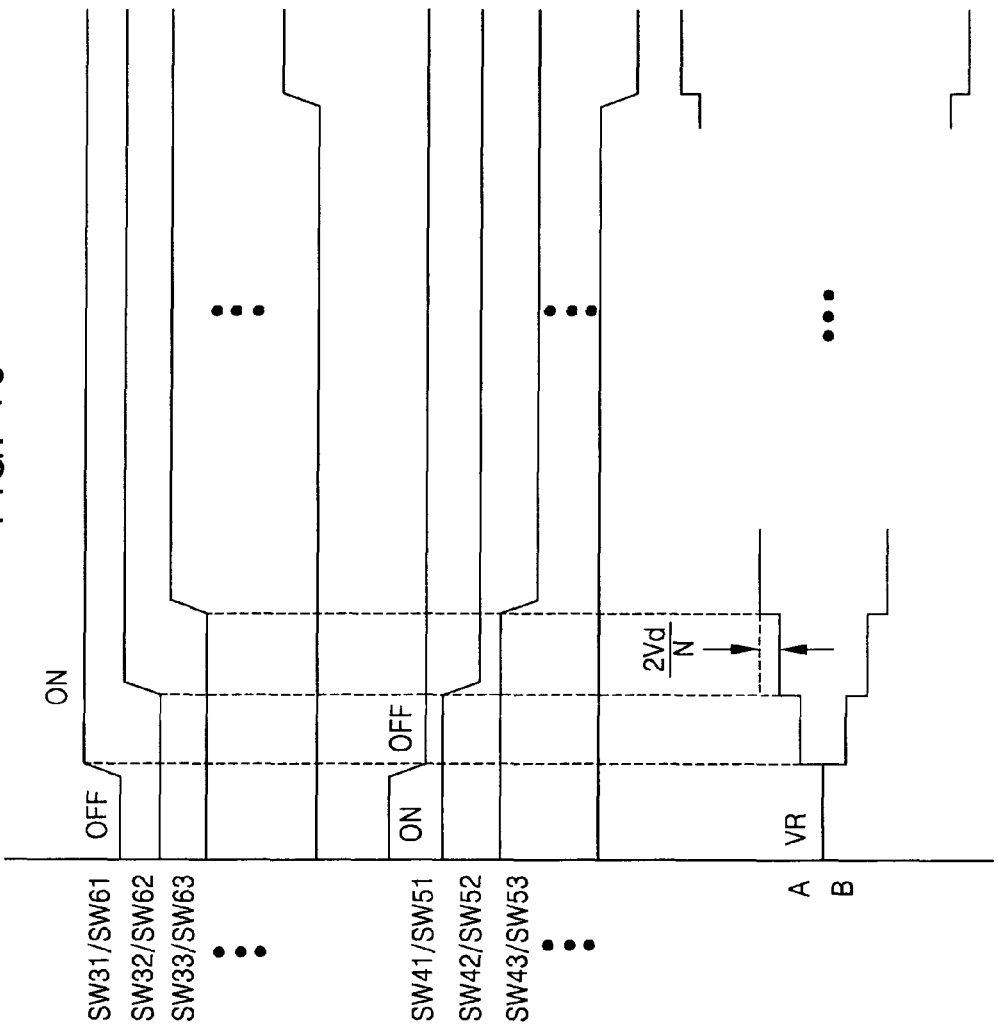
FIG. 10 is a timing diagram of control signals for illustrating generation of ramp voltages at the first and second nodes of FIGS. 8 and 9, according to an embodiment of the present invention.

For example referring to FIG. 10, the switches SW31 and SW61 are closed and the switches SW41 and SW51 are opened within the first comparator unit 412-1 such that the voltage at the first node A increases by 2Vd/N, and the voltage at the second node B decreases by 2Vd/N. Subsequently, the switches SW32 and SW62 are closed and the switches SW42 and SW52 are opened within the second comparator unit 412₂ such that the voltage at the first node A further increases by another increment of 2Vd/N, and the voltage at the second node B further decreases by another increment of 2Vd/N.

Thereafter, the switches SW33 and SW63 are closed and the switches SW43 and SW53 are opened within the third comparator unit 412₃ such that the voltage at the first node A increases again by another increment of 2 Vd/N, and the voltage at the second node B decreases again by another increment of 2 Vd/N. Such third switching operations are performed sequentially through the rest of the comparator units 412₄ through 412-N for generating a first ramp voltage that is increasing in increments of 2 Vd/N at the first node A, and for generating a second ramp voltage that is decreasing in increments of 2 Vd/N at the second node B, as illustrated in FIG. 10.

With such ramp voltages applied at the nodes A and B, each of the comparators COM1 through COMN generates a respective output that makes a logical transition at a respective time point indicating a respective level of the respective pixel signal voltage Vs. The column memory 54 stores a respective gray code from the gray code generator 53 at such a respective time point for each of the comparators COM1 through COMN.

In this manner, such stored digital codes are analog-to-digital conversions of the respective pixel signals Vs for each of the comparator units 412-1 through 412-N. For example, if N is 1024, 10-bit analog-to-digital conversion is possible.

Figure 11:
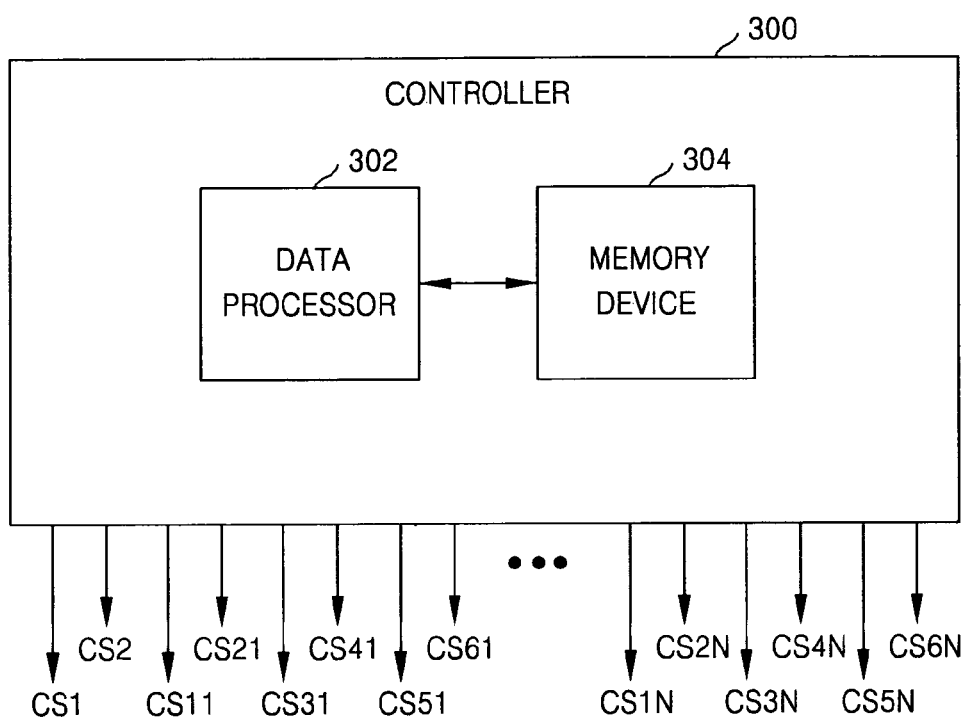
FIG. 11 shows a block diagram of an example controller in FIG. 4, according to an embodiment of the present invention.

FIG. 11 illustrates an example controller for the control circuit 300 of FIG. 4. The controller 300 includes a data processor 302 and a memory device 304 having sequences of instruction (i.e. software) stored thereon. Execution of such sequences of instruction by the data processor 302 causes the data processor 302 to perform the functions described herein for the control circuit 300. In particular, the data processor 302 generates respective control signals for controlling operation of all of the switches of the ADC block 410.

For example, control signals CS1 and CS2 are generated by the controller 300 for controlling the operations of the global switches SW1 and SW2, respectively. Control signals CS11 through CS1N are generated by the controller 300 for controlling operation of the switches SW11 through SW1N, respectively. Control signals CS21 through CS2N are generated by the controller 300 for controlling operation of the switches SW21 through SW2N, respectively. Control signals CS31 through CS3N are generated by the controller 300 for controlling operation of the switches SW31 through SW3N, respectively.

Control signals CS41 through CS4N are generated by the controller 300 for controlling operation of the switches SW41 through SW4N, respectively. Control signals CS51 through CS5N are generated by the controller 300 for controlling operation of the switches SW51 through SW5N, respectively. Control signals CS61 through CS6N are generated by the controller 300 for controlling operation of the switches SW61 through SW6N, respectively.

As described above, a CMOS image sensor of the present invention includes a respective capacitor array and respective switches integrated into each of the comparator units 412-1 through 412-N. Such capacitors and switches across the comparator units 412-1 through 412-N are operated for generating ramp voltages for such comparator units 412-1 through 412-N. Thus, circuit area and power consumption of the CMOS image sensor may be minimized. In addition, the ramp signals generated by such integrated capacitors and switches may have enhanced monotonicity for high-accuracy analog-to-digital conversion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An analog-to-digital converter in an image sensor, comprising:
   a plurality of comparator units each including:
      a respective comparator;
      a first respective capacitor coupled between a first node and a respective third node;
      a second respective capacitor coupled between a second node and a respective fourth node;
      a third respective capacitor coupled between the first node and a first input of the respective comparator;
      a fourth respective capacitor coupled between the second node and a second input of the respective comparator; and
      respective switches; and
   a controller for controlling the respective switches to couple a subset of the first respective capacitors of the plurality of comparator units between the first node and a first reference voltage, and to couple another subset of the first respective capacitors between the first node and a second reference voltage, for generating a first ramp voltage at the first node,
   and wherein the controller controls the respective switches to couple a subset of the second respective capacitors of the plurality of comparator units between the second node and the first reference voltage, and to couple another subset of the second respective capacitors between the second node and the second reference voltage, for generating a second ramp voltage at the second node.

2. The analog-to-digital converter of claim 1, wherein the respective switches for each comparator unit include:
   a first respective switch for coupling a pixel signal to the first input of the respective comparator;
   a second respective switch for coupling a reset signal to the second input of the respective comparator;
   third and fourth respective switches for coupling the first reference voltage to one of the respective third and fourth nodes; and
   fifth and sixth respective switches for coupling the second reference voltage to the other one of the respective third and fourth nodes.

3. The analog-to-digital converter of claim 2, wherein the first reference voltage is lower than the second reference voltage,
   and wherein the controller controls the third, fourth, fifth, and sixth respective switches such that the second reference voltage is coupled to the respective third node and the first reference voltage is coupled to the respective fourth node when the pixel signal is coupled to the first input of the respective comparator and when the reset signal is coupled to the second input of the respective comparator, during first and second switching operations, and wherein the controller controls the first and second respective switches to be opened during a third switching operation, and wherein the controller controls the third, fourth, fifth and sixth respective switches for determining which one of the respective third and fourth nodes is coupled to the first reference voltage with the other one of the respective third and fourth nodes being coupled to the second reference voltage during the third switching operation.

4. The analog-to-digital converter of claim 3, further comprising:

a first global switch for coupling a third reference voltage to the first node during the first and second switching operations; and a second global switch for coupling the third reference voltage to the second node during the first and second switching operations;

wherein the first and second global switches are opened during the third switching operation.

5. The analog-to-digital converter of claim 4, wherein the controller includes a data processor and a memory device having sequences of instructions stored thereon, and wherein execution of the sequences of instructions by the data processor causes the data processor to perform the step of:

generating switch control signals for controlling the first, second, third, fourth, fifth, and sixth respective switches and the first and second global switches during the first, second, and third switching operations.

6. The analog-to-digital converter of claim 4, further comprising:

a reference voltage generator for generating the first, second, and third reference voltages.

7. The analog-to-digital converter of claim 1, wherein the first and second ramp voltages are each changed in incremental steps of a difference between the first and second reference voltages divided by a number of the plurality of comparator units.

8. The analog-to-digital converter of claim 1, further comprising:

a code generator that generates a bit code that changes with time; and a memory device that stores a respective bit code from the code generator when a respective output of the respective comparator makes a logical transition.

9. An image sensor comprising:

a pixel array;

a row driver for controlling the pixel array to generate a respective pixel signal and a respective reset signal for each of a plurality of pixels;

a plurality of comparator units each including for a corresponding one of the pixels:

a respective comparator;

a first respective capacitor coupled between a first node and a respective third node;

a second respective capacitor coupled between a second node and a respective fourth node;

a third respective capacitor coupled between the first node and a first input of the respective comparator;

a fourth respective capacitor coupled between the second node and a second input of the respective comparator; and respective switches; and a controller for controlling the respective switches to couple a subset of the first respective capacitors of the plurality of comparator units between the first node and a first reference voltage, and to couple another subset of the first respective capacitors between the first node and a second reference voltage, for generating a first ramp voltage at the first node, and wherein the controller controls the respective switches to couple a subset of the second respective capacitors of the plurality of comparator units between the second node and the first reference voltage, and to couple another subset of the second respective capacitors between the second node and the second reference voltage, for generating a second ramp voltage at the second node.

10. The image sensor of claim 9, wherein the respective switches for each comparator unit include:

a first respective switch for coupling the respective pixel signal to the first input of the respective comparator;

a second respective switch for coupling the respective reset signal to the second input of the respective comparator;

third and fourth respective switches for coupling the first reference voltage to one of the respective third and fourth nodes; and fifth and sixth respective switches for coupling the second reference voltage to the other one of the respective third and fourth nodes.

11. The image sensor of claim 10, wherein the first reference voltage is lower than the second reference voltage, and wherein the controller controls the third, fourth, fifth, and sixth respective switches such that the second reference voltage is coupled to the respective third node and the first reference voltage is coupled to the respective fourth node when the pixel signal is coupled to the first input of the respective comparator and when the reset signal is coupled to the second input of the respective comparator, during first and second switching operations, and wherein the controller controls the first and second respective switches to be opened during a third switching operation, and wherein the controller controls the third, fourth, fifth and sixth respective switches for determining which one of the respective third and fourth nodes is coupled to the first reference voltage with the other one of the respective third and fourth nodes being coupled to the second reference voltage during the third switching operation.

12. The image sensor of claim 11, further comprising:

a first global switch for coupling a third reference voltage to the first node during the first and second switching operations; and a second global switch for coupling the third reference voltage to the second node during the first and second switching operations;

wherein the first and second global switches are opened during the third switching operation.

13. The image sensor of claim 12, further comprising:

a reference voltage generator for generating the first, second, and third reference voltages;

a code generator that generates a bit code that changes with time;

a memory device that stores a respective bit code from the code generator when a respective output of the respective comparator makes a logical transition, for each of the comparator units; and a column driver that drives the memory device to output the respective bit code corresponding to each of the comparator units.

14. The image sensor of claim 9, wherein the first and second ramp voltages are each changed in incremental steps of a difference between the first and second reference voltages divided by a number of the plurality of comparator units.

15. A method of performing analog-to-digital conversion within an image sensor comprising:

coupling a pixel signal to a first input of a respective comparator and coupling a reset signal to a second input of the respective comparator within a respective comparator unit for a corresponding pixel of the image sensor;

wherein the respective comparator unit includes respective switches, a first respective capacitor coupled between a first node and a respective third node, a second respective capacitor coupled between a second node and a respective fourth node, a third respective capacitor coupled between the first node and the first input of the respective comparator, and a fourth respective capacitor coupled between the second node and the second input of the respective comparator; and controlling the respective switches to couple a subset of the first respective capacitors of a plurality of comparator units between the first node and a first reference voltage, and to couple another subset of the first respective capacitors between the first node and a second reference voltage, to generate a first ramp voltage at the first node; and controlling the respective switches to couple a subset of the second respective capacitors of the plurality of comparator units between the second node and the first reference voltage, and to couple another subset of the second respective capacitors between the second node and the second reference voltage, to generate a second ramp voltage at the second node.

16. The method of claim 15, further comprising:
controlling a first respective switch to couple the pixel signal to the first input of the respective comparator;
controlling a second respective switch to couple the reset signal to the second input of the respective comparator;
controlling third and fourth respective switches to couple the first reference voltage to one of the respective third and fourth nodes; and
controlling fifth and sixth respective switches to couple the second reference voltage to the other one of the respective third and fourth nodes.

17. The method of claim 16, wherein the first reference voltage is lower than the second reference voltage, the method further comprising:

controlling the third, fourth, fifth, and sixth respective switches such that the second reference voltage is coupled to the respective third node and the first reference voltage is coupled to the respective fourth node when the pixel signal is coupled to the first input of the respective comparator and when the reset signal is coupled to the second input of the respective comparator, during first and second switching operations;

controlling the first and second respective switches to be opened during a third switching operation; and controlling the third, fourth, fifth, and sixth respective switches for determining which one of the respective third and fourth nodes is coupled to the first reference voltage with the other one of the respective third and fourth nodes being coupled to the second reference voltage during the third switching operation.

18. The method of claim 17, further comprising:
controlling a first global switch to couple a third reference voltage to the first node during the first and second switching operations;
controlling a second global switch to couple the third reference voltage to the second node during the first and second switching operations; and
controlling the first and second global switches to be opened during the third switching operation.

19. The method of claim 15, wherein the first and second ramp voltages are each changed in incremental steps of a difference between the first and second reference voltages divided by a number of the plurality of comparator units.

20. The method of claim 15, further comprising:
generating a bit code that changes with time; and
storing a respective bit code when a respective output of the respective comparator makes a logical transition.

* * * * *